(12) United States Patent
Saga

(10) Patent No.: US 6,536,136 B2
(45) Date of Patent: Mar. 25, 2003

(54) SUBSTRATE TRANSFER APPARATUS AND SUBSTRATE METHOD

(75) Inventor: Koichiro Saga, Kanagawa (JP)

(73) Assignee: Sony Corporation (JP)

( * ) Notice: Subject to any disclaimer, the term of this patent is extended or adjusted under 35 U.S.C. 154(b) by 24 days.

(21) Appl. No.: 09/769,353

(22) Filed: Jan. 26, 2001

(65) Prior Publication Data

US 2001/0026747 A1 Oct. 4, 2001

(30) Foreign Application Priority Data

Jan. 28, 2000 (JP) .................................. 2000-019602
May 16, 2000 (JP) .................................. 2000-142713

(51) Int. Cl.$^7$ .......................... F26B 25/00; B65G 49/00
(52) U.S. Cl. .............................. 34/417; 34/242; 34/423; 414/935; 414/939
(58) Field of Search ............................. 414/935, 939; 34/417, 423, 451, 540, 635, 636, 589, 242; 277/590, 913

(56) References Cited

U.S. PATENT DOCUMENTS

| | | | | |
|---|---|---|---|---|
| 3,554,268 A | * | 1/1971 | Taylor | 164/65 |
| 4,469,335 A | * | 9/1984 | Moore | 277/27 |
| 5,076,205 A | * | 12/1991 | Vowles et al. | 118/719 |
| 5,112,277 A | * | 5/1992 | Cruz et al. | 454/195 |
| 5,135,608 A | * | 8/1992 | Okatuni | 156/643 |
| 5,273,423 A | * | 12/1993 | Shiraiwa | 432/241 |
| 5,820,692 A | * | 10/1998 | Baecker et al. | 134/21 |
| 5,884,917 A | * | 3/1999 | Yamaga | 277/3 |
| 6,135,460 A | * | 10/2000 | Wise et al. | 277/628 |
| 6,152,669 A | * | 11/2000 | Morita et al. | 414/217 |
| 6,283,175 B1 | * | 9/2001 | Shimazu | 141/98 |

* cited by examiner

Primary Examiner—Ira S. Lazarus
Assistant Examiner—K. B. Rinehart
(74) Attorney, Agent, or Firm—Rader, Fishman & Grauer PLLC; Ronald P. Kananen, Esq.

(57) ABSTRACT

To provide a substrate transfer apparatus capable of forming a hermetically-closed space integrated between a normal substrate processing apparatus which is not integrated with a substrate transfer unit and a substrate transfer container, the substrate transfer apparatus includes a main body in a box-like shape containing a substrate W, an upper opening (first opening) provided at the main body and connected to a bottom opening (substrate transfer port) of a container while maintaining an air tight state against outside air, a side wall opening (second opening) provided at the main body and connected to a substrate transfer port of the transfer processing apparatus while maintaining the air tight state against outside air, an exhaust pipe connected to the main body, an opening/closing mechanism for opening and closing a bottom lid relative to the bottom opening in a state in which the upper opening and the bottom opening of the container are connected and transfer mechanisms installed in the main body for transferring the substrate W.

22 Claims, 6 Drawing Sheets

SUBSTRATE TRANSFER APPARATUS AND SUBSTRATE METHOD

BACKGROUND OF THE INVENTION

1. Field of the Invention

The present invention relates to a substrate transfer apparatus and a substrate transfer method, particularly to a substrate transfer apparatus and a substrate transfer method used for transferring an electronic substrate requiring high cleanliness such as a semiconductor wafer or a liquid crystal substrate between a substrate transfer container and a substrate processing apparatus.

2. Description of the Related Art

There is carried out fabrication of an electronic apparatus using an electronic substrate (hereinafter, described as substrate) such as a semiconductor wafer, a liquid crystal substrate for a display apparatus or a magnetic disk at inside of a dustless clean room. Meanwhile, when a substrate is transferred among respective substrate processing apparatus, the transfer operation is carried out in a state in which a substrate held in a cassette is contained in a portable hermetically-closable locally cleaned container (that is, substrate transfer container). Thereby, a substrate can be transferred without exposing the substrate to dust and dirt in the atmosphere at inside and outside of a clean room. Such a substrate transfer container is on sale under a commercial name of SMIF (Standard Mechanical Interface) pod (Assist Technology Co., Ltd.) and is constituted to mechanically connect to respective substrate processing apparatus as disclosed in Japanese Patent Publication No. 46694/1995 and Japanese Patent Laid-Open No. 46011/1996.

In the meantime, in fabrication of a high added-value and highly integrated device in recent years, molecule adsorption contamination at a surface of a substrate effects adverse influence on a device/process characteristic. Therefore, when a substrate requesting particularly high cleanliness such as a semiconductor wafer is transferred, inside of a substrate transfer container contained with the substrate is replaced by inert gas such as argon (Ar) or nitrogen gas ($N_2$) (hereinafter, referred to as inert gas) to thereby prevent molecule adsorption contamination of organic substance, boron or phosphor to the substrate and formation of natural oxide film on the surface of the substrate.

Further, when only inside of a substrate transfer container is replaced by inert gas, during a time period until a substrate is transferred from a substrate processing apparatus to inside of the substrate transfer container (vice versa), the surface of the substrate is exposed to the atmosphere at inside of a clean room and accordingly, formation of natural oxide film on the surface of the substrate cannot be prevented. Therefore, there have been proposed mechanical interface apparatus as disclosed in Japanese Patent Laid-Open No. 221319/1996 and Japanese Patent Laid-Open No. 139410/1997. The mechanical interface apparatus is constituted such that in a state in which with respect to a substrate processing apparatus integrated with a substrate transfer unit (hereinafter, described as transfer unit) which serves also as a container opening/closing unit, inside of the transfer unit and inside of the substrate transfer container are replaced by gas, these are communicated with each other and transfer of a substrate is carried out.

However, an object of such a mechanical interface apparatus is a substrate processing apparatus previously integrated with a transfer unit. Therefore, in a normal substrate processing apparatus which is not integrated with the transfer unit, a substrate cannot be transferred between the substrate processing apparatus and a substrate transfer container while preventing formation of natural oxide film at the surface of the substrate. In order to carry out such substrate transfer operation to a substrate processing apparatus which is not integrated with a transfer unit, it is necessary to connect the substrate transfer container to the substrate transfer apparatus and the substrate transfer apparatus to the substrate processing apparatus while maintaining an air tight state against outside air. However, the conventional substrate transfer apparatus is not constructed by a constitution assuming such connection and accordingly, the substrate cannot be transferred from the substrate transfer container to the substrate processing apparatus (vice versa) without exposing the substrate to the atmosphere.

SUMMARY OF THE INVENTION

Hence, it is an object of the present invention to provide a substrate transfer apparatus capable of forming a hermetically-closed space integrated between a normal substrate processing apparatus and a substrate transfer container and a substrate transfer method capable of transferring a substrate between the substrate transfer container and the substrate processing apparatus without contaminating the substrate by adsorption of gas molecules in the atmosphere.

In order to achieve such an object, according to an aspect of the present invention, there is provided a substrate transfer apparatus used for transferring a substrate between a substrate transfer container and a substrate processing apparatus, the substrate transfer apparatus comprising a main body in a box-like shape contained with the substrate, a first opening provided at the main body and connected to a substrate transfer port of the substrate transfer container while maintaining an air tight state against outside air, a second opening provided at the main body and connected to a substrate transfer port of the substrate processing apparatus while maintaining the air tight state against outside air, an exhaust pipe connected to the main body, an opening/closing mechanism for opening and closing a lid provided at the substrate transfer port in a state in which the first opening and the substrate transfer port of the substrate transfer container are connected, and a transfer mechanism installed at inside of the main body for transferring the substrate.

According to such a substrate transfer apparatus, by connecting the second opening provided at the main body and the substrate transfer port of the substrate processing apparatus, the main body and the substrate processing apparatus are communicated with each other and the substrate transfer apparatus is subsequently attached to the substrate processing apparatus. Further, by the first opening and the second opening provided at the main body, the main body is communicated with the substrate transfer container and the substrate processing apparatus while maintaining the air tight state against outside air and accordingly, the substrate is transferred between the substrate transfer container and the substrate processing apparatus via the main body without exposing the substrate to outside air. Further, gas in the main body is exhausted from the exhaust pipe and accordingly, inside of the main body is maintained in an inert atmosphere.

Further, according to another aspect of the present invention, there is provided a substrate transfer method for transferring a substrate between a substrate transfer container and a substrate processing apparatus, the substrate transfer method comprising a step of communicating the substrate transfer container and the substrate transfer apparatus insides of which are maintained in an inert atmosphere while maintaining an air tight state against outside air and transferring the substrate between the substrate transfer container and the substrate transfer apparatus by a substrate transfer mechanism provided at inside of the substrate transfer apparatus, and a step of communicating the substrate transfer apparatus and the substrate processing apparatus the insides of which are maintained in the inert atmosphere while maintaining the air tight state against outside air and transferring the substrate between the substrate transfer apparatus and the substrate processing apparatus by the substrate transfer mechanism.

According to the substrate transfer method having such a constitution, the substrate can be transferred while maintaining the substrate in the inert atmosphere between the substrate transfer container and the substrate transfer apparatus and between the substrate transfer apparatus and the substrate processing apparatus.

DETAILED DESCRIPTION OF THE PREFERRED EMBODIMENTS

A detailed explanation will be given of embodiments of a substrate transfer apparatus and a substrate transfer method according to the present invention in reference to the drawings as follows. An explanation will be given here of embodiments for respective constitutions of substrate processing apparatus (hereinafter, described as processing apparatus) for connecting substrate transfer apparatus (hereinafter, described as transfer apparatus) in reference to the respective drawings. Further, the processing apparatus is defined as a processing apparatus which is generally used in, for example, fabrication steps of a semiconductor device such as a cleaning apparatus, a thin film depositing apparatus, a dry etching apparatus or a graphing apparatus.

(First Embodiment)

Figure 1:
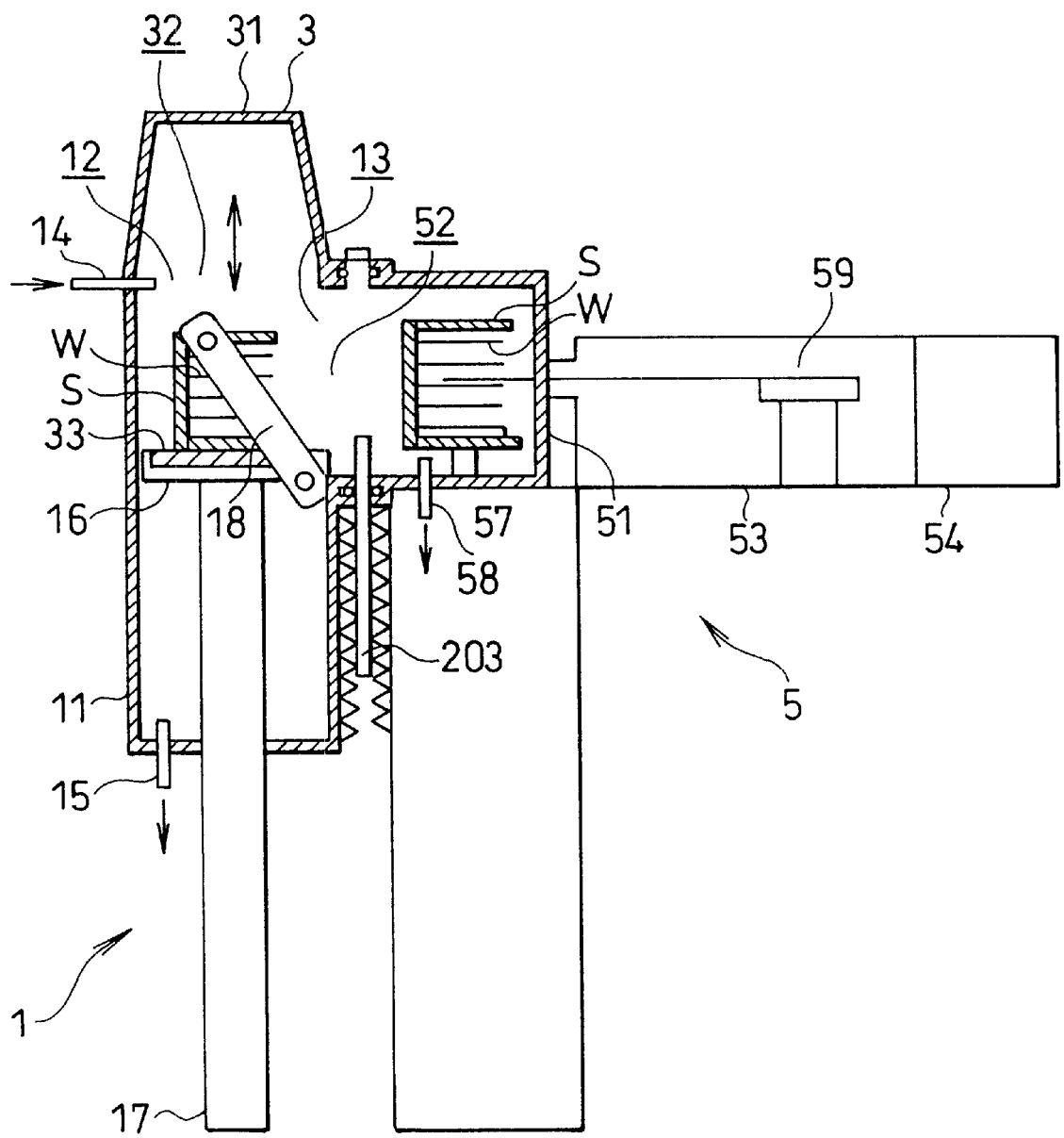
FIG. 1 is an outline constitution view for explaining a first embodiment of the present invention.

As shown by FIG. 1, a transfer apparatus 1 is provided with a main body 11 in a box-like shape, an upper opening (first opening) 12 and a sidewall opening (second opening) 13 provided to the main body 11, a gas introducing pipe 14 and an exhaust pipe 15 connected to the main body 11, an opening/closing mechanism 16 installed at inside of the main body 11, a cassette elevator 17 and a transfer arm 18.

The main body 11 is provided with a size for containing a cassette S holding a substrate W. An inner wall of the main body 11 is constituted by a metal and a wall face thereof at a height position the same as that of, for example, the side wall opening 13 is constituted by a transparent material. In this case, as the transparent material, there is used a material having a small gas emission amount, preferably capable of restraining the gas emission amount to about 0.1 ng/(cm²×h) such as a glass material, polyvinyl chloride, amorphous polyolefine or polycarbonate.

Further, the upper opening 12 is constituted to connect to a bottom opening (substrate transfer port) 32 provided in a main body 31 of a substrate transfer container (hereinafter, described as container) 3. Although illustration thereof is omitted here, the upper opening 12 is constructed by a flange structure constituted by forming a groove at a peripheral edge portion coinciding with an opening edge of the bottom opening 32 of the container 3 and, an O ring is fitted into the groove. Further, by bringing the peripheral edge portion of the upper opening 12 in, for example, mechanical press contact with the opening edge of the bottom opening 32 of the container 3, the upper opening 12 and the bottom opening 32 are connected to each other while maintaining an air tight state against outside air.

Further, the side wall opening 13 is constituted to connect to a substrate transfer port 52 provided at a side wall of a load/lock chamber 51 of a processing apparatus 5. A detailed explanation will be given here of the constitution of the connecting portion in reference to FIG. 2 and FIG. 3.

Figure 2:
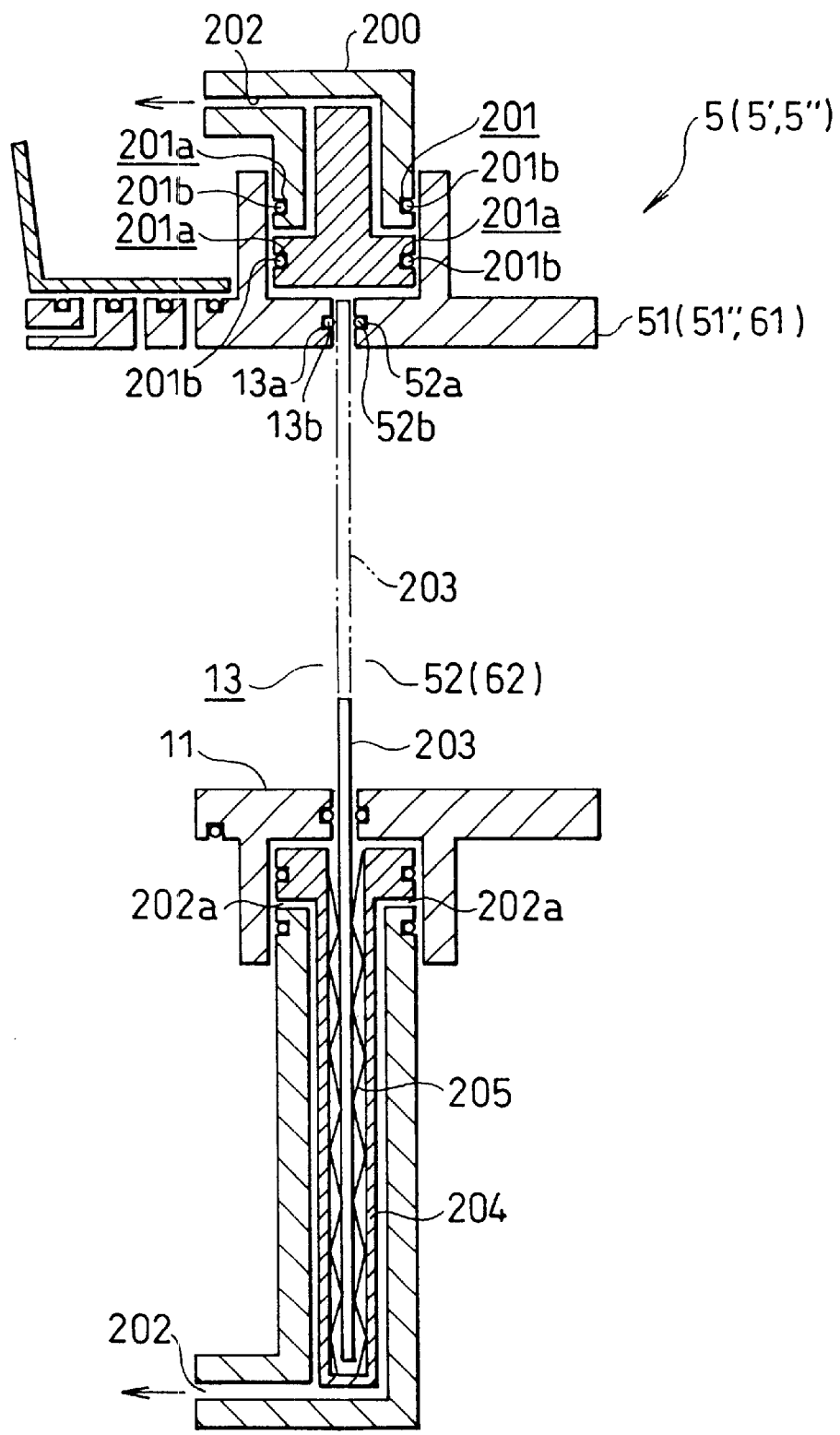
FIG. 2 is a sectional view of a connecting portion in a substrate transfer apparatus of the present invention.
Figure 3:
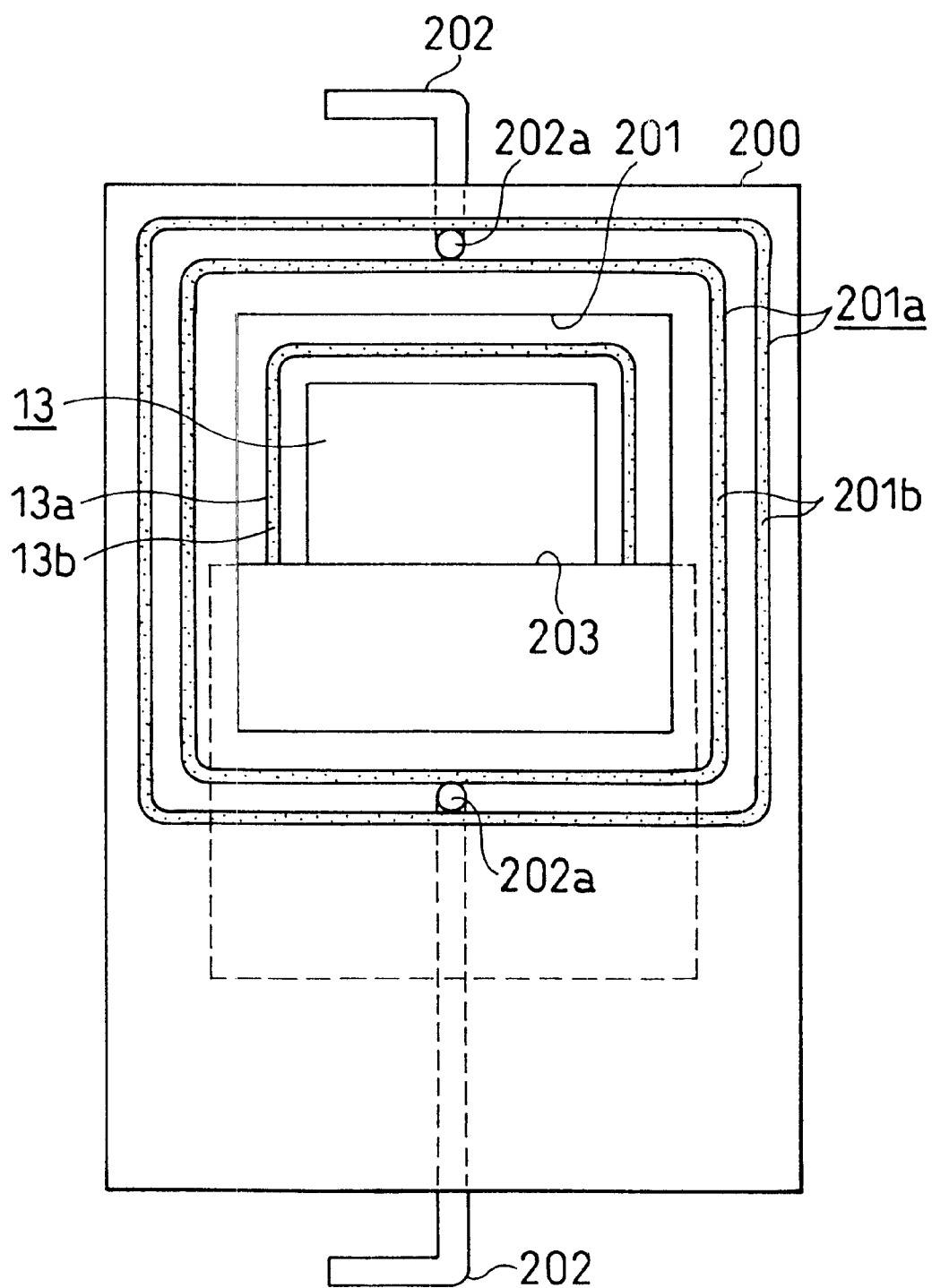
FIG. 3 is a front view of the connecting portion in the substrate transfer apparatus of the present invention.

FIG. 2 shows a sectional view of the connecting portion for connecting the side wall opening 13 and the substrate transfer port 52 and FIG. 3 shows a front view facing the side of the main body 11 from the side of the side wall opening 13. As shown by the drawings, the side wall opening 13 of the main body 11 is connected to the substrate transfer port 52 in which an O ring 52b is fitted to inside of a groove 52a formed over a total periphery of an opening end. Further, the side wall opening 13 is constructed by a flange structure projected from a wall face and at an opening end corresponding to a front end thereof (that is, a position opposed to the groove 52a formed at a surrounding of the substrate transfer port 52), a groove 13a is formed over a total periphery thereof and an O ring 13b is fitted to inside thereof.

Further, the side wall opening 13 is provided with, for example, connecting means 200. The connecting means 200 is provided with an opening 201 a size larger than the side wall opening 13 and is installed such that the side wall opening 13 and the O ring 13b at inside of the groove 13a are arranged at inside of the opening 201. Further, a face of the connecting means 200 facing the side of the main body 11 and a face thereof facing the side of the processing apparatus 5, are provided with double grooves 201a to surround the opening 201 and O rings 201b are respectively fitted into the grooves 201a to thereby constitute double packings. Further, exhaust ports 202a of exhaust pipes 202 are provided between the double grooves 201a. Further, the exhaust pipes 202 are provided with an exhaust pump, not illustrated here, and inside gas is drawn from the exhaust ports 202a to outside via the inside of the connecting means 200.

Further, the connecting means 200 is provided with a shutter 203 for closing the opening 201. The shutter 203 is slidably contained in a door pocket 204 provided at inside of the connecting means 200 and is provided projectably from an inner wall of the opening 201. Further, the door pocket 204 is hermetically closed against outside air. Further, bellows 205 for covering both faces of the shutter 203 may be provided at inside of the door pocket 204.

Further, in a state in which the side wall opening 13 provided with the connecting means 200 is arranged to be opposed to the substrate transfer port 52 of the processing apparatus 5, the O rings 201b (double packings) of the connecting means 200 are brought into contact with the wall face of the processing apparatus 5 and there is formed a gap for inserting the shutter 203 between the O ring 52b of the substrate transfer port 52 and the O ring 13b of the side wall opening 13.

According to the connecting portion constituted in this way, in a state in which the side wall opening 13 having the connecting means 200 is arranged to be opposed to the substrate transfer port 52 of the processing apparatus 5, by exhausting inside gas from the exhaust ports 202a between the double packings, the O rings 202b of the connecting means 200 are adsorbed in vacuum to the side wall of the processing apparatus 5 and the side wall of the main body 11. Therefore, the load/lock chamber. 51 of the processing apparatus 5 and the main body 11 of the substrate transfer apparatus 1 are connected in a hermetically-closed state via the connecting means 200. Further, in a state in which the side wall opening 13 is closed by the shutter 203, by depressurizing inside of the load/lock chamber 51 relative to the main body 11, the shutter 203 is adsorbed in vacuum to the substrate transfer port 52 of the load/lock chamber 51, the O ring 52b provided at the substrate transfer port 51 is brought into press contact with the shutter 203, thereby, inside of the load/lock chamber 51 is hermetically closed. In the meantime, in the state in which the shutter 203 is closed, by depressurizing inside of the main body 11 relative to the load/lock chamber 51, the shutter 203 is adsorbed in vacuum to the side wall opening 13 of the main body 11, the O ring 52b provided at the side wall opening 13 is brought into press contact with the shutter 203, thereby, inside of the main body 11 is hermetically closed.

Further, the gas introducing pipe 14 shown in FIG. 1 is connected to the main body 11 at a position thereof extremely proximate to the upper opening 12 and supplies to inside of the main body 11, inert gas such as argon gas, nitrogen gas, or inert gas such as dry air (preferably having moisture content of 10 ppm).

Further, the exhaust pipe 15 is connected to the main body 11 at a vicinity of a bottom portion of the main body 11, connected to an exhaust pump via an exhaust valve, not illustrated here, and exhausts gas at inside of the main body 11. Further, the main body 11 may be provided with a circulation path for circulating gas in the main body 11.

Figure 4:
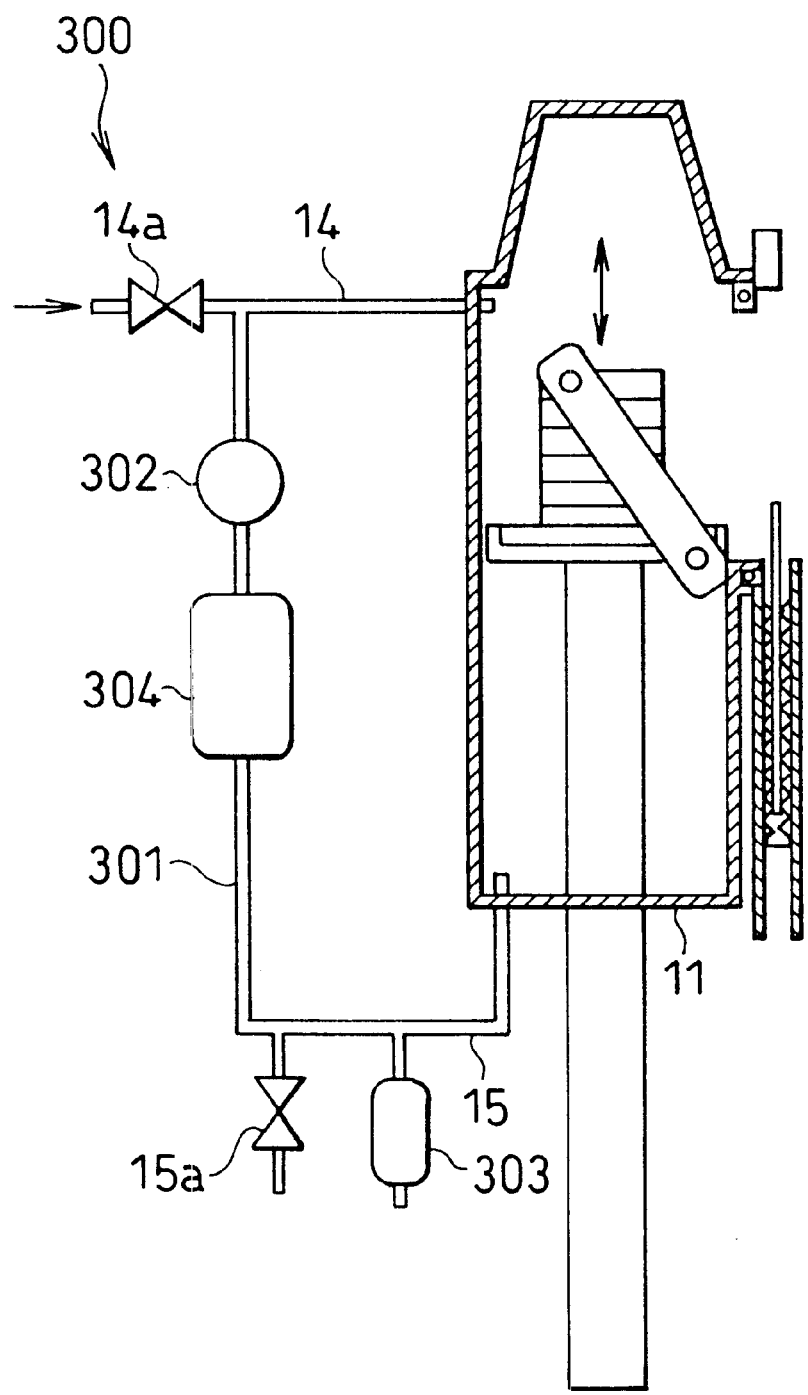
FIG. 4 is a constitution view of a circulation path in the substrate transfer apparatus of the present invention.

FIG. 4 shows an example of the circulation path. The circulation path 300 is constituted by connecting the gas introducing pipe 14 and the exhaust pipe 15 by a pipe 301 and providing a circulation pump 302 at the pipe 301 on the main body side of a gas supply valve 14a provided at the gas introducing pipe 14 and on the main body side of an exhaust valve 15a provided at the exhaust pipe 15. The circulation pump 302 is installed to make gas flow from the side of the exhaust pipe 15 toward the side of the gas introducing pipe 14.

Further, the circulation path 300 is provided with a measuring unit 303 connected to a portion of the exhaust pipe 15 on the main body side of the exhaust valve 15a for measuring oxygen content and moisture content in exhaust gas. Further, the pipe 301 is provided with an adsorbing chamber 304 having a filter for adsorbing and removing oxygen and a filter for adsorbing and removing moisture and is constituted such that gas flowing in the pipe 301 passes through the respective filters in the adsorbing chamber 304. In this case, as filter members, there are used, for example, copper catalyzer for adsorbing and removing oxygen and molecular sieve for adsorbing moisture. As a catalyzer adsorption unit having such filter members, there may be used, for example, an inert gas cleaning apparatus GR60-A type, GR60/2-A type of Dulton Co. Ltd. or inert gas refining apparatus MB-20-G-T-W, MB1-50B-G, Labmaster130 or Labstar50 made by MBRAUN Co. Ltd. Further, the adsorbing chamber 304 may individually be provided for respective object molecule to be adsorbed and removed.

Further, the opening/closing mechanism 16 shown in FIG. 1 is constituted to be mounted with a bottom lid 33 in a state of closing the bottom opening 32 of the container 3 and remove the mounted bottom lid 33 from the main body 31 of the container 3.

The cassette elevator 17 is constituted by a shaft-like member erected at the bottom portion of the opening/closing mechanism 16 for freely elevating the opening/closing mechanism 16 in a range from the bottom portion of the container 3 to the lower portion of the side wall opening 13.

Further, in a state in which the opening/closing mechanism 16 is lowered to the lower portion of the side wall opening 13 by elevating and lowering operation of the cassette elevator 17, the transfer arm 18 transfers the cassette S mounted on the bottom lid 33 of the opening/closing mechanism 16 from above the bottom lid 33 to inside of the load/lock chamber 51 of the processing apparatus 5 and transfers thereof in a direction reverse thereto.

As described above, according to the transfer apparatus 1 explained in reference to FIG. 1 through FIG. 4, by connecting the side wall opening 13 provided at the main body 11 and the substrate transfer port 52 provided at the processing apparatus 5 via the connecting means 200, the main body 11 and the load/lock chamber 51 can be communicated with each other while maintaining the hermetically-closed state and the transfer apparatus 1 can be attached subsequently to the processing apparatus 5. Further, by the side wall opening 13 and the upper opening 12 provided at the main body 11, the main body 11 can be communicated to the container 3 and the processing apparatus 5 while maintaining the hermetically-shield state against outside air and therefore, the substrate W can be transferred between the container 3 and the processing apparatus 5 via inside of the main body 11 without being exposed to outside air. Further, by exhausting gas from the exhaust pipe 15 connected to the main body 11 and supplying inert gas from the gas supply pipe 14, inside of the main body 11 can be replaced by inert gas. As a result, even in the case of a processing apparatus which is not integrated with a substrate transfer unit, by subsequently attaching the transfer apparatus 1, the substrate W can be transferred between the processing apparatus and a container while preventing the substrate W from adsorbing gas.

Further, since the inner wall of the main body 11 is constituted by using metal or resin having a small gas emission amount, gas emission from the inner wall can be restrained to be low and contamination of the surface of the substrate W can be prevented. Further, when a portion of the wall face of the main body 11 is constituted by transparent resin, a state of transferring the substrate W at inside of the main body 11 can be monitored from the transparent resin portion.

Further, by providing the circulation path 300 having the adsorbing chamber 304, while removing oxygen and moisture, gas at inside of the main body 11 can be circulated. Therefore, after inside of the main body 11 reaches an inert atmosphere to some degree, without continuing to supply fresh inert gas from the gas introducing pipe 14, the gas atmosphere in the main body 11 can be maintained to be inert and the inert gas can be saved.

Next, an explanation will be given of a constitution example of the processing apparatus 5 connected with the transfer apparatus 1 in such a constitution.

As shown by, for example, FIG. 1, the processing apparatus 5 is provided with the load/lock chamber 51 provided as a transfer chamber of the substrate W, a substrate standby chamber 53 connected to the load/lock chamber 51 and a processing chamber 54 connected to the substrate standby chamber 53 and the respective chambers are connected via openable and closable shutters (not illustrated) while maintaining an air tight state against outside air.

The side wall of the load/lock chamber 51 is provided with the substrate transfer port 52 connected to the side wall opening 13 provided at the main body 11 of the transfer apparatus 1 in the state of maintaining the air tight state against outside air. The substrate transfer port 52 is constructed by the flange structure constituted by forming the groove 52a at the peripheral edge portion facing the side wall opening 13 and the O ring 52b is fitted into the groove 52a, for example, as described above.

At inside of the load/lock chamber 51, there is installed an elevator 57 for elevating the cassette S holding the substrate W to a predetermined height. Further, the load/lock chamber 51 is connected with an exhaust pipe 58 having an exhaust pump.

Further, at inside of the substrate standby chamber 53, there is installed an arm 59 for taking out, sheet by sheet, the substrate W at inside of the cassette S introduced into the load/lock chamber 51 and transferring the substrate W into the processing chamber 54 and for containing the substrate W at inside of the processing chamber 54 to the cassette S of the load/lock chamber 51.

The transfer apparatus 1 having the above-described constitution is connected to the processing apparatus 5 having such a constitution and the substrate is transferred between the container 3 and the processing apparatus 5 as follows.

First, previously, the side wall opening 13 of the transfer apparatus 1 and the substrate transfer port 52 of the processing apparatus 5 are connected and the main body 11 of the transfer apparatus 1 and the load/lock chamber 51 of the processing apparatus 5 are communicated with each other in the hermetically-closed state. Further, the bottom opening 32 of the container 3 in which the substrate W held by the cassette S is contained and inside of which is replaced by inert gas (for example, nitrogen), is connected to the upper opening 12 of the transfer apparatus 1. Thereby, the upper opening 12 of the transfer apparatus 1 is closed by the bottom lid 33 of the container 3 and there is brought about a hermetically-closed state in which the main body 11 of the transfer apparatus 1 and the load/lock chamber 51 of the processing apparatus 5 are communicated with each other.

Next, while exhausting gas from the exhaust pipe 15 of the main body 11 and the exhaust pipe 58 of the load/lock chamber 51, inert gas (for example, nitrogen) is introduced from the gas introducing pipe 14 to insides of the main body 11 and the load/lock chamber 51, thereby, the insides are replaced by an inert atmosphere.

At this occasion, by the measuring unit 303 provided at the exhaust pipe 15, moisture concentration and oxygen concentration in the gas exhausted from the main body 11 are analyzed. Further, when the moisture concentration and the oxygen concentration reach predetermined values (for example, 1000 ppm or smaller), the gas supply valve 14a of the gas introducing pipe 14 is closed, introduction of inert gas to inside of the main body 11 is stopped and the exhaust valve 15a of the exhaust pipe 15 is closed. Simultaneously therewith, the circulation pump 302 of the pipe 301 is operated and the gas at inside of the main body 11 is circulated via the circulation path 300.

Thereafter, by opening the bottom lid 33 of the container 3 by the opening/closing mechanism 16 and lowering the cassette elevator 17, the cassette S mounted on the bottom lid 33 is transferred into the main body 11. Next, by the transfer arm 18, the cassette S is transferred from inside of the main body 11 onto the cassette elevator 57 at inside of the load/lock chamber 51. Next, the substrate transfer port 52 is closed by the shutter 203, the load/lock chamber 51 is hermetically closed against the main body 11 and gas at inside of the load/lock chamber 51 is exhausted from the exhaust pipe 58 to thereby bring the inside of the load/lock chamber 51 into a predetermined depressurized state.

Thereafter, a shutter (not illustrated) between the load/lock chamber 51 and the substrate standby chamber 53 is opened and while adjusting the height of the cassette S by lowering or elevating the cassette elevator 57, the substrate W is taken out from the cassettes by the arm 59 at inside of the substrate standby chamber 53 and is transferred into the substrate standby chamber 53. Next, the shutter between the load/lock chamber 51 and the substrate standby chamber 53 is closed, a shutter (not illustrated) between the substrate standby chamber 53 and the processing chamber 54 is opened and the substrate W at inside of the substrate standby chamber 53 is transferred into the processing chamber 54 by the arm 59.

After transferring the substrate W from inside of the container 3 to inside of the processing chamber 54 as described above, the shutter between the substrate standby chamber 53 and the processing chamber 54 is closed and the substrate W is processed at inside of the processing chamber 54.

Further, after finishing to process the substrate W, the substrate W is returned to inside of the container 3 by a procedure reverse to the above-described. At this occasion, the gas at inside of the main body 11 of the transfer apparatus 1 is circulated at inside of the circulation path 300 to thereby maintain the inert atmosphere and by opening the shutter 203, the inert gas at inside of the main body 11 is introduced into the load/lock chamber 51 in the depressurized state. Further, when the cassette S is contained into the container 3 by elevating the cassette elevator 17, the cassette elevator 17 is temporarily stopped immediately before the bottom opening 32 of the container 3 is completely closed by the bottom lid 33 and under the state, inert gas is supplied from the gas introducing pipe 14 of the main body 11, thereby, inside of the container 3 is firmly brought into the inert atmosphere, preferably, moisture concentration and oxygen concentration in the container 3 is made to be equal to or smaller than 1000 ppm. Thereafter, the cassette elevator 17 is elevated again, the bottom lid 33 is closed by the opening/closing mechanism 16 and the container 3 is hermetically closed against the main body 11 of the transfer apparatus 1.

After the above-described operation, the container 3 is removed from the transfer apparatus 1, transferred to a processing apparatus used in a successive step, the substrate W is transferred to the successive processing apparatus similar to the above-described and the substrate W is processed at inside of the hermetically-closed processing chamber.

According to the transfer method explained above, from the container 3 to the transfer apparatus 1and from the transfer apparatus 1 to the processing apparatus 5, the substrate W can be transferred while maintaining the substrate W in the inert atmosphere. Therefore, the substrate W can be transferred between the container 3 and the processing apparatus 5 in the state preventing contamination of the substrate W by adsorption of gas molecules in the atmosphere.

Further, in a state in which inside of the main body 11 is maintained in an inert atmosphere to some degree, supply of inert gas from the gas introducing pipe 14 is stopped and gas at inside of the main body 11 is circulated by using the circulation path 300. Here, conventionally, with an object of maintaining the inert atmosphere at inside of the main body 11, a small amount of inert gas continues flowing and accordingly, a large amount of the inert gas has been consumed. However, by circulating the gas at inside of the main body 11 while passing through the adsorbing chamber 304 as in the embodiment, the gas atmosphere at inside of the main body 11 can be maintained to be inert while saving the inert gas.

(Second Embodiment)

Figure 5:
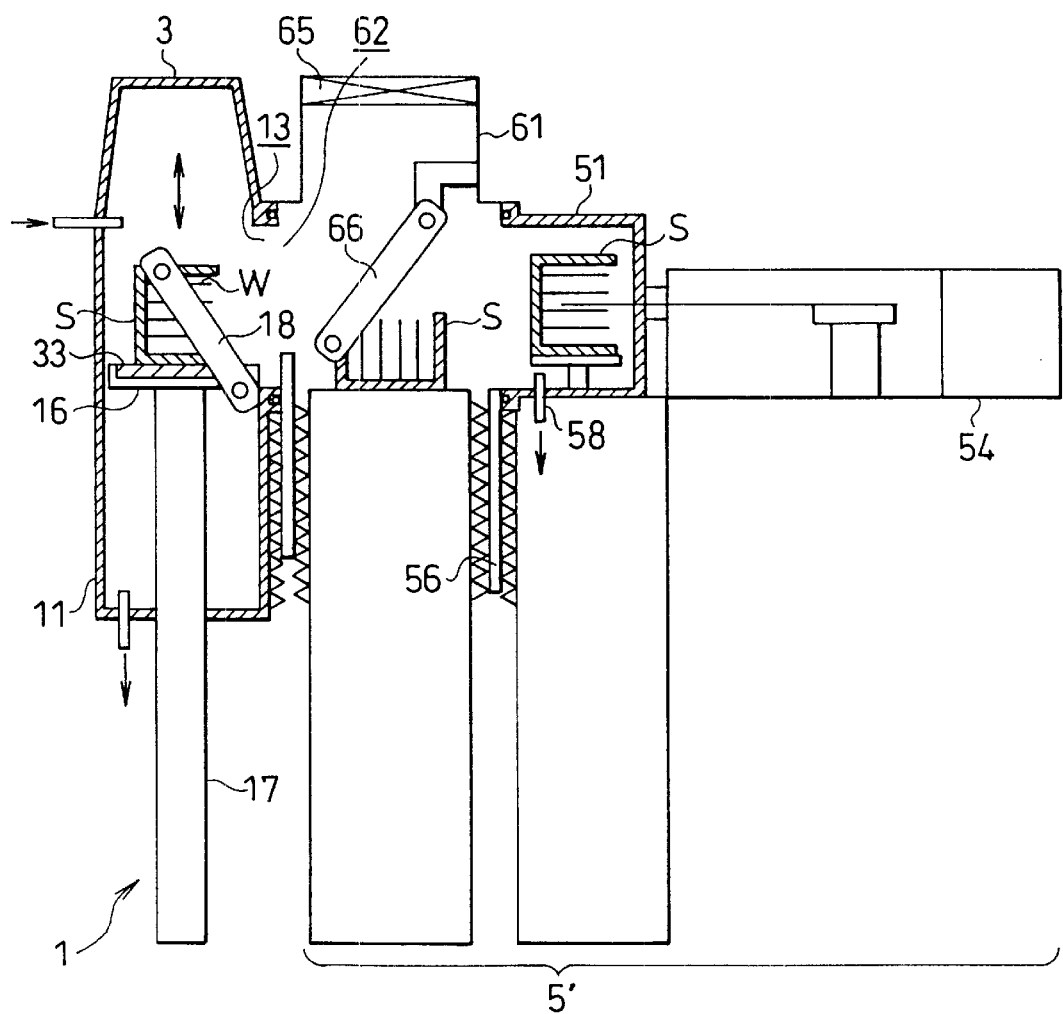
FIG. 5 is an outline constitution view for explaining a second embodiment of the present invention.

FIG. 5 shows a constitution when the transfer apparatus 1 having the constitution explained in reference to FIG. 1 through FIG. 4, is connected to a processing apparatus having other constitution.

A processing apparatus 51 shown in FIG. 5 is constructed by a constitution having a cassette standby chamber 61 as a prechamber of the load/lock chamber 51 in the processing apparatus shown in FIG. 1. Therefore, the side wall opening 13 provided at the main body 11 of the transfer apparatus 1 is connected to a substrate transfer port 62 provided at a side wall of the cassette standby chamber 61 while maintaining an air tight state against outside air. Further, the load/lock chamber 51 and the cassette standby chamber 61 are connected via an openable and closable shutter 56 while maintaining the air tight state against outside air.

Further, the cassette standby chamber 61 is installed with a filter 65 at an entire face of a ceiling portion thereof and is installed with a cassette transfer arm 66 for transferring the cassette S transferred from inside of the main body 11 of the transfer apparatus 1 between the cassette standby chamber 61 and the load/lock chamber 51.

The substrate is transferred by connecting the transfer apparatus 1 to the processing apparatus 5' constituted in this way as follows.

First, previously, the side wall opening 13 of the transfer apparatus 1 and the substrate transfer port 62 of the processing apparatus 5' are connected via the connecting means 200 and the main body 11 of the transfer apparatus 1, the cassette standby chamber 61 of the processing apparatus 5' and the load/lock chamber 51 are communicated to each other. Further, the bottom opening 32 of the container 3 in which the substrate W held by the cassette S is contained and inside of which is replaced by inert gas (for example, nitrogen), is connected to the upper opening 12 of the transfer apparatus 1. Thereby, the upper opening 12 of the transfer apparatus 1 is closed by the bottom lid 33 of the container 3 and there is brought about a hermetically-closed state in which inside of the main body 11 of the transfer apparatus 1, and insides of the cassette standby chamber 61 and the load/lock chamber 51 of the processing apparatus 5' are communicated with each other.

Next, while exhausting gas from the exhaust pipe 15 of the main body 11 and the exhaust pipe 58 of the load/lock chamber 51, by introducing inert gas (for example, nitrogen) from the gas introducing pipe 14 to insides of the cassette standby chamber 61 and the load/lock chamber 51, the insides are replaced by an inert atmosphere.

At this occasion, similar to the first embodiment, when moisture concentration and oxygen concentration measured by the measuring unit 303 reach predetermined values (for example, 1000 ppm or smaller), introduction of inert gas from the gas introducing pipe 14 to inside of the main body 11 is stopped and the exhaust valve 15a of the exhaust pipe 15 is closed. Gas at inside of the main body 11 is circulated by operating the circulation pump 302 of the pipe 301.

Thereafter, by opening the bottom lid 33 of the container 3 by the opening/closing mechanism 16 and lowering the cassette elevator 17, the cassette S mounted on the bottom lid 33 is transferred into the main body 11. Next, the cassette S is transferred from inside of the main body 11 to inside of the cassette standby chamber 61 by the transfer arm 18. Successively, the cassette S at inside of the cassette standby chamber 61 is transferred to the load/lock chamber 51 by the cassette transfer arm 66.

After the above-described operation, the substrate transfer port 52 is closed by the shutter 56, the load/lock chamber 51 is hermetically closed against the main body 11 and the cassette standby chamber 61 and thereafter, similar to the first embodiment explained above, the substrate W is transferred into the processing chamber 54. After finishing to process the substrate W at inside of the processing chamber 54, the substrate W is returned to inside of the container 3 by a procedure reverse to that in transferring in the substrate W.

Even in the case of such transfer method, similar to the first embodiment, in the state of preventing contamination of the substrate W by adsorption of gas in the atmosphere, the substrate W can be transferred between the container 3 and the processing apparatus 5'. Further, inert gas can be saved.

(Third Embodiment)

Figure 6:
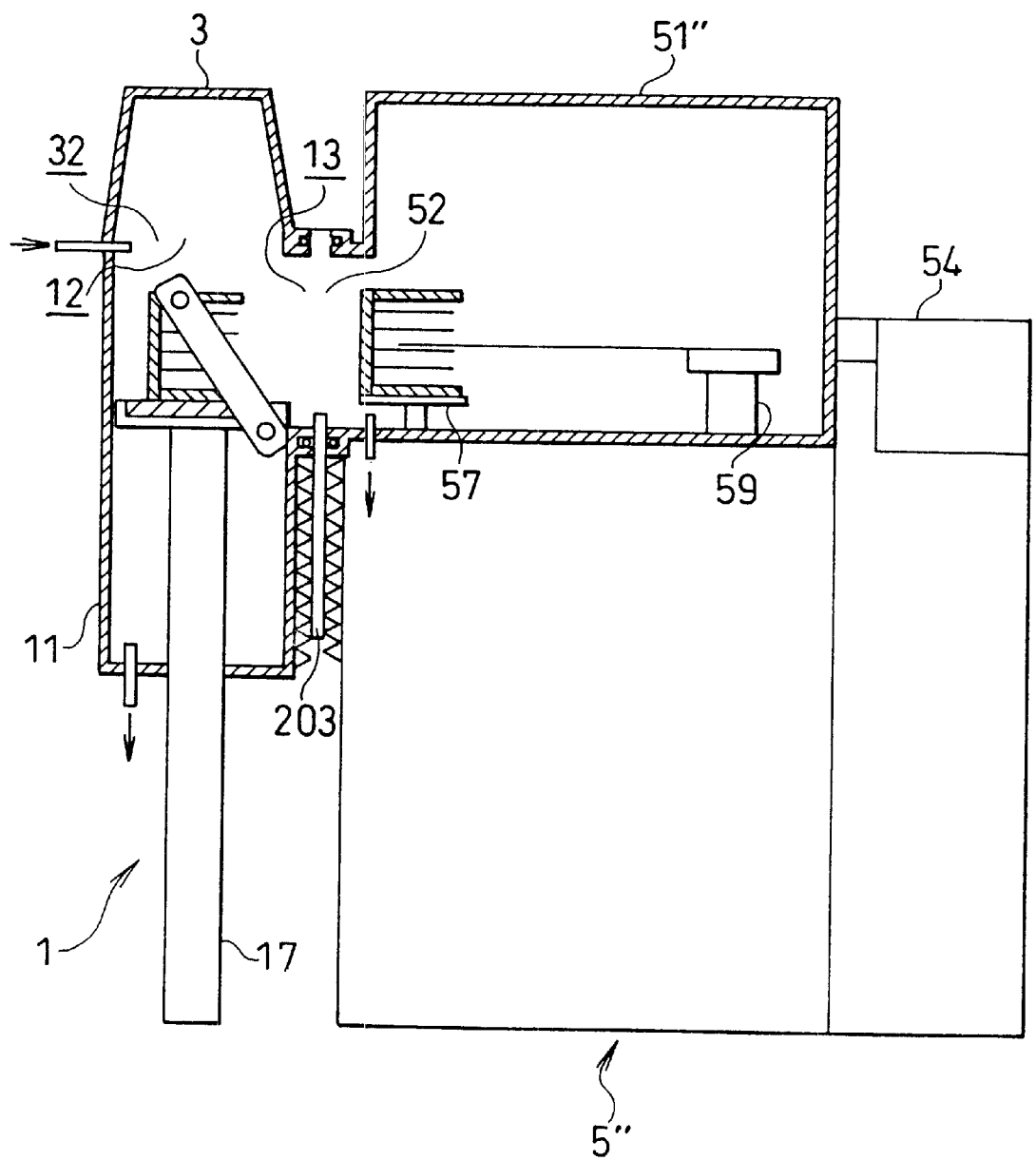
FIG. 6 is an outline constitution view for explaining a third embodiment of the present invention.

FIG. 6 shows a constitution when the substrate transfer apparatus 1 having the constitution explained in reference to FIG. 1 through FIG. 4, is connected to a processing apparatus 5" having still other constitution.

The substrate processing apparatus 5" shown in FIG. 6 is constructed by a constitution having a load/lock chamber 51" constituted by integrating the lock/lock chamber (51) and the substrate standby chamber (52) of the processing apparatus shown in FIG. 1. At inside of the load/lock chamber 51", there is installed the arm 59 for taking out, sheet by sheet, the substrate W held in the cassette S transferred from inside of the container 3, transferring the substrate W to inside of the processing chamber 54 and containing the substrate W at inside of the processing chamber 54 to the cassette S in the load/lock chamber 51".

The substrate is transferred by connecting the transfer apparatus 1 to the processing apparatus 5" constituted in this way as follows.

First, previously, the side wall opening 13 of the transfer apparatus 1 and the substrate transfer port 52 of the processing apparatus 5" are connected via the connecting means 200 and the main body 11 of the transfer apparatus 1 and the load/lock chamber 51" of the processing apparatus 5' are communicated with each other. Further, the bottom opening 32 of the container 3 in which the substrate W held in the cassette S is contained and inside of which is replaced by inert gas (for example, nitrogen), is connected to the upper opening 12 of the transfer apparatus 1. Thereby, the upper opening 12 of the transfer apparatus 1 is closed by the bottom lid 33 of the container 3 and there is brought about a hermetically-closed state in which the main body 1 of the transfer apparatus 1 and inside of the load/lock chamber 51" of the processing apparatus 5 are communicated with each other.

In the following, similar to the first embodiment, the main body 11 and inside of the load/lock chamber 51" are replaced by an inert atmosphere and in a state in which a predetermined inert atmosphere is reached, gas at inside thereof is circulated by the circulation path 300 provided at the main body 11. Under the state, after transferring the cassette S to above the cassette elevator 57 at inside of the load/lock chamber 51", the shutter 203 is closed and inside of the load/lock chamber 51" is brought into a depressurized state. Next, a shutter (not illustrated) between the load/lock chamber 51" and the processing chamber 54 is opened and while adjusting the height of the cassette S by lowering or elevating the cassette elevator 57, the substrate W is taken out from the cassette S by the arm 59 at inside of the load/lock chamber 51" and is transferred to inside of the processing chamber 54.

After the substrate W is transferred from inside of the container 3 to inside of the processing chamber 54 as described above, the shutter between the load/lock chamber 51" and the processing chamber 54 is closed and the substrate W is processed at inside of the processing chamber 54.

After finishing to process the substrate W, the substrate W is returned to inside of the container 3 by a procedure reverse to the above-described. At this occasion, similar to the first embodiment, inside of the main body 11 of the transfer apparatus 1 is maintained in an inert atmosphere and by opening the shutter 203 between the load/lock chamber 51" and the main body 11, the inert gas at inside of the main body 11 is introduced to inside of the load/lock chamber 51" in the depressurized state. Further, when the cassette S is contained at inside of the container 3 by elevating the cassette elevator 17, the operation is carried out similar to the first embodiment.

Even by such a transfer method, similar to the first embodiment and the second embodiment, in a state in which contamination of the substrate W by adsorption of gas molecules in the atmosphere. is prevented, the substrate W can be transferred between the container 3 and the processing apparatus 5" and the inert gas can be saved.

According to the above-described embodiments, an explanation has been given of the transfer apparatus 1 having the constitution of providing the connecting means 200 having the shutter 203 at the side wall opening 13. However, when it is not necessary to provide the shutter at the connecting portion for connecting the transfer apparatus and the processing apparatus, it is not necessary to provide the connecting means 200 having such a constitution. For example, as in the processing apparatus exemplified in reference to FIG. 5 in the second embodiment, when the cassette standby chamber 61 is provided as the prechamber of the load/lock chamber 51 via the openable and closable shutter 56 while maintaining the hermetically-closed state, it is not necessary to provide the shutter 203 between the cassette standby chamber 61 and the main body 11 of the transfer apparatus.

In such a case, by constructing a constitution in which double packings are provided at the surrounding of the side wall opening 13 of the main body 11 and an exhaust port is provided between the double packings, the side wall opening 13 can be connected, while maintaining the hermetically-closed state, to the substrate transfer port 62 of the cassette standby chamber 61, thereby, an effect similar to that in the above-described embodiments can be achieved.

As has been explained above, according to the substrate transfer apparatus, of the invention, by the first opening and the second opening provided at the main body of the substrate transfer apparatus, the main body can be communicated with the substrate transfer container and the substrate processing apparatus while maintaining the air tight state against outside air. Therefore, even in the case of substrate processing apparatus which is not integrated with the substrate transfer unit, the substrate transfer apparatus can be attached subsequently and while restraining apparatus cost in substrate fabrication, the substrate can be transferred between the container and the substrate processing apparatus while preventing adsorption of gas molecules to the substrate.

Further, according to the substrate transfer method of the present invention, the substrate can be transferred between the substrate transfer container and the substrate processing apparatus without contaminating the substrate by gas molecules in the air. Therefore, at the surface of the substrate, growth of undesirable substance such as natural oxide film can be prevented and processing at the substrate processing apparatus can stably be carried out. As a result, in an electronic apparatus using an electronic substrate (substrate), quality such as electric property can be maintained and the yield can be promoted.

What is claimed is:

1. A substrate transfer apparatus used for transferring a substrate between a substrate transfer container and a substrate processing apparatus, said substrate transfer apparatus comprising:

a main body contained with the substrate;

a first opening provided at the main body and connected to a substrate transfer port of the substrate transfer container while maintaining an air tight state against outside air;

a second opening provided at the main body and connected to a substrate transfer port of the substrate processing apparatus while maintaining the air tight state against outside air, the opening having a door slidable between an open and closed position, an edge of the door resting in a groove when the door is in a closed position, the groove having seals disposed on opposite sides of the groove and positioned proximate opposite faces of the door when the door is in a closed state, wherein a pressure differential between one side of the door and an opposite side of the door presses the face of the door against one of the seals to assist in creating a hermetic seal;

an exhaust pipe connected to the main body;

an opening/closing mechanism for opening and closing a lid provided at the substrate transfer port of the substrate transfer container in a state in which the first opening and the substrate transfer port of the substrate transfer container are connected;

a transfer mechanism installed at inside of the main body for transferring the substrate; and wherein the first opening is disposed at a top portion of the main body and positioned perpendicular to the second opening.

2. The substrate transfer apparatus according to claim 1, wherein an inner wall of the main body is constituted by a metal.

3. The substrate transfer apparatus according to claim 1, wherein at least a portion of the main body is constituted by a transparent material.

4. The substrate transfer apparatus according to claim 1, wherein a peripheral edge of the second opening is provided with:

double packings brought into contact with a wall face at a surrounding of the substrate transfer port of the substrate processing apparatus; and an exhaust pipe for exhausting a gas between the double packings.

5. The substrate transfer apparatus according to claim 1, wherein:
   the main body is provided with a gas introducing pipe for introducing an inert gas into the main body and is provided with a circulation path for circulating the gas in the main body; and
   circulation path is provided with at least one of an adsorbing chamber for adsorbing and removing oxygen and an adsorbing chamber for adsorbing and removing moisture.

6. The substrate transfer apparatus according to claim 1, further comprising a housing that encapsulates the door when the door is in an open position.

7. The substrate transfer apparatus according to claim 6, further comprising an evacuation device connected to the housing adapted to evacuate fluid from within the housing.

8. The substrate transfer apparatus according to claim 1, further comprising an evacuation device connected to the groove adapted to evacuate fluid from the groove.

9. The substrate transfer apparatus according to claim 1, further comprising an elevator movable between a first position and a second position, the first position locating a platform of the elevator proximate the substrate transfer container and the second position locating the platform in the main body.

10. The substrate transfer apparatus according to claim 1, wherein the transfer mechanism includes a transfer arm pivotally movable between a first position and a second position, the transfer arm adapted to attach to the substrate and move the substrate from the first position to the second position, the first position locating the substrate in the main body and the second position locating the substrate in the substrate processing apparatus.

11. A substrate transfer method for transferring a substrate between a substrate transfer container and a substrate processing apparatus, said substrate transfer method comprising:
   a step of communicating the substrate transfer container and the substrate transfer apparatus inside of which are maintained in an inert atmosphere while maintaining an air tight state against outside air and transferring the substrate between the substrate transfer container and the substrate transfer apparatus by a substrate transfer mechanism provided at inside of the substrate transfer apparatus;
   a step of communicating the substrate transfer apparatus and the substrate processing apparatus the insides of which are maintained in the inert atmosphere while maintaining the air tight state against outside air and transferring the substrate between the substrate transfer apparatus and the substrate processing apparatus by the substrate transfer mechanism; and
   a step of selecting one of a plurality of individual components of the substrate and loading the one individual component into a processing chamber;
   wherein the step of communicating the substrate transfer apparatus and the substrate processing apparatus includes the step of opening a door between the substrate transfer apparatus and the substrate processing apparatus, the door being slidable between an open and closed position, an edge of the door resting in a groove when the door is in a closed position, the groove having seals disposed on opposite sides of the groove and positioned proximate opposite faces of the door when the door is in a closed state, wherein a pressure differential between one side of the door and an opposite side of the door presses the face of the door against one of the seals to create a hermetic seal;
   wherein the first opening is disposed at a top portion of the main body and positioned perpendicular to the second opening.

12. The substrate transfer method according to claim 11, wherein the inert atmosphere at the insides of the substrate transfer container, the substrate transfer apparatus and the substrate processing apparatus is a nitrogen gas atmosphere.

13. The substrate transfer method according to claim 11, wherein in communicating the substrate transfer apparatus and the substrate processing apparatus, in a state in which double packings provided over a total periphery of an opening portion of the substrate transfer apparatus are brought into contact with a surrounding of an opening portion of the substrate processing apparatus, an intermediary between the double packings is depressurized.

14. The substrate transfer method according to claim 11, wherein in a state in which the inside of the substrate transfer apparatus is brought into the inert atmosphere, a gas at the inside of the substrate transfer apparatus is circulated via a circulation path and at least one of moisture and oxygen in the gas is adsorbed and removed in the circulation path.

15. The substrate transfer apparatus according to claim 11, further comprising a housing that encapsulates the door when the door is in an open position.

16. The substrate transfer apparatus according to claim 15, further comprising an evacuation device connected to the housing adapted to evacuate fluid from within the housing.

17. The substrate transfer method according to claim 11, further comprising an elevator movable between a first position and a second position, the first position locating a platform of the elevator proximate the substrate transfer container and the second position locating the platform in the main body.

18. A substrate transfer apparatus used for transferring a substrate between a substrate transfer container and a substrate processing apparatus, said substrate transfer apparatus comprising:
   a main body contained with the substrate;
   a first opening provided at the main body and connected to a substrate transfer port of the substrate transfer container while maintaining an air tight state against outside air;
   a second opening provided at the main body and connected to a substrate transfer port of the substrate processing apparatus while maintaining the air tight state against outside air, the opening having a door slidable between an open and closed position, an edge of the door resting in a groove when the door is in a closed position, the groove having seals disposed on opposite sides of the groove and positioned proximate opposite faces of the door when the door is in a closed state, wherein a pressure differential between one side of the door and an opposite side of the door. presses the face of the door against one of the seals to assist in creating a hermetic seal;
   an exhaust pipe connected to the main body;
   an opening/closing mechanism for opening and closing a lid provided at the substrate transfer port in a state in which the first opening and the substrate transfer port of the substrate transfer container are connected;
   a transfer mechanism installed at inside of the main body for transferring the substrate; and
   an evacuation device connected to the groove adapted to evacuate fluid from the groove.

19. A substrate transfer apparatus used for transferring a substrate between a substrate transfer container and a substrate processing apparatus, said substrate transfer apparatus comprising:

a main body contained with the substrate;

a first opening provided at the main body and connected to a substrate transfer port of the substrate transfer container while maintaining an air tight state against outside air;

a second opening provided at the main body and connected to a substrate transfer port of the substrate processing apparatus while maintaining the air tight state against outside air, the opening having a door slidable between an open and closed position, an edge of the door resting in a groove when the door is in a closed position, the groove having seals disposed on opposite sides of the groove and positioned proximate opposite faces of the door when the door is in a closed state, wherein a pressure differential between one side of the door and an opposite side of the door presses the face of the door against one of the seals to assist in creating a hermetic seal;

an exhaust pipe connected to the main body;

an opening/closing mechanism for opening and closing a lid provided at the substrate transfer port in a state in which the first opening and the substrate transfer port of the substrate transfer container are connected;

a transfer mechanism installed at inside of the main body for transferring the substrate; and wherein the transfer mechanism includes a transfer arm pivotally movable between a first position and a second position, the transfer arm adapted to attach to the substrate and move the substrate from the first position to the second position, the first position locating the substrate in the main body and the second position locating the substrate in the substrate processing apparatus.

20. A substrate transfer method for transferring a substrate between a substrate transfer container and a substrate processing apparatus, said substrate transfer method comprising:

a step of communicating the substrate transfer container and the substrate transfer apparatus inside of which are maintained in an inert atmosphere while maintaining an air tight state against outside air and transferring the substrate between the substrate transfer container and the substrate transfer apparatus by a substrate transfer mechanism provided at inside of the substrate transfer apparatus;

a step of communicating the substrate transfer apparatus and the substrate processing apparatus the insides of which are maintained in the inert atmosphere while maintaining the air tight state against outside air and transferring the substrate between the substrate transfer apparatus and the substrate processing apparatus by the substrate transfer mechanism; and a step of selecting one of a plurality of individual components of the substrate and loading the one individual component into a processing chamber;

wherein the step of communicating the substrate transfer apparatus and the substrate processing apparatus includes the step of opening a door between the substrate transfer apparatus and the substrate processing apparatus, the door being slidable between an open and closed position, an edge of the door resting in a groove when the door is in a closed position, the groove having seals disposed on opposite sides of the groove and positioned proximate opposite faces of the door when the door is in a closed state, wherein a pressure differential between one side of the door and an opposite side of the door presses the face of the door against one of the seals to create a hermetic seal; and wherein an evacuation device connected to the groove adapted to evacuate fluid from the groove.

21. The substrate transfer method according to claim 20, further comprising an elevator movable between a first position and a second position, the first position locating a platform of the elevator proximate the substrate transfer container and the second position locating the platform in the main body.

22. A substrate transfer method for transferring a substrate between a substrate transfer container and a substrate processing apparatus, said substrate transfer method comprising:

a step of communicating the substrate transfer container and the substrate transfer apparatus inside of which are maintained in an inert atmosphere while maintaining an air tight state against outside air and transferring the substrate between the substrate transfer container and the substrate transfer apparatus by a substrate transfer mechanism provided at inside of the substrate transfer apparatus;

a step of communicating the substrate transfer apparatus and the substrate processing apparatus the insides of which are maintained in the inert atmosphere while maintaining the air tight state against outside air and transferring the substrate between the substrate transfer apparatus and the substrate processing apparatus by the substrate transfer mechanism; and a step of selecting one of a plurality of individual components of the substrate and loading the one individual component into a processing chamber;

wherein the step of communicating the substrate transfer apparatus and the substrate processing apparatus includes the step of opening a door between the substrate transfer apparatus and the substrate processing apparatus, the door being slidable between an open and closed position, an edge of the door resting in a groove when the door is in a closed position, the groove having seals disposed on opposite sides of the groove and positioned proximate opposite faces of the door when the door is in a closed state, wherein a pressure differential between one side of the door and an opposite side of the door presses the face of the door against one of the seals to create a hermetic seal; and wherein the transfer mechanism includes a transfer arm pivotally movable between a first position and a second position, the transfer arm adapted to attach to the substrate and move the substrate from the first position to the second position, the first position locating the substrate in the main body and the second position locating the substrate in the substrate processing apparatus.

* * * * *